United States Patent [19]

Kasuga

[11] Patent Number: 4,472,785
[45] Date of Patent: Sep. 18, 1984

[54] SAMPLING FREQUENCY CONVERTER

[75] Inventor: Masao Kasuga, Sagamihara, Japan

[73] Assignee: Victor Company of Japan, Ltd., Yokohama, Japan

[21] Appl. No.: 311,095

[22] Filed: Oct. 13, 1981

[30] Foreign Application Priority Data

Oct. 13, 1980 [JP] Japan ................................. 55-142750
Nov. 4, 1980 [JP] Japan ................................. 55-154872

[51] Int. Cl.$^3$ .............................................. G06F 1/00
[52] U.S. Cl. ..................................... 364/718; 328/155
[58] Field of Search ................ 364/718, 723, 724, 328

[56] References Cited

U.S. PATENT DOCUMENTS 3,997,772 12/1976 Crochiere et al. ................... 364/718

Primary Examiner—Gareth D. Shaw
Assistant Examiner—Tim A. Wiens
Attorney, Agent, or Firm—Ladas & Parry

[57] ABSTRACT

A sampling frequency converter for converting a first signal sampled at a first sampling frequency f1 into a second signal sampled at a second sampling frequency f2 comprising an interpolation device supplied with the first signal, for inserting L−1 zeros (L is an integer) for every sampling time, a filter circuit for attenuating a frequency component over a frequency f/2 (f is a frequency) within an output signal of said interpolation device, where the filter circuit has a series circuit consisting of a finite impulse response digital filter and an infinite impulse response digital filter, and the frequency f is equal to the first sampling frequency f1 when f1<f2 and equal to the second sampling frequency f2 when f1>f2, and a decimation device for extracting every M-th (M is an integer) output signal of the filter circuit, to produce said second signal.

5 Claims, 12 Drawing Figures

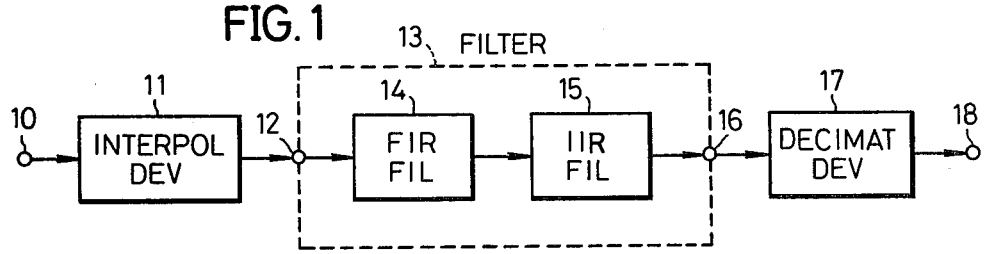
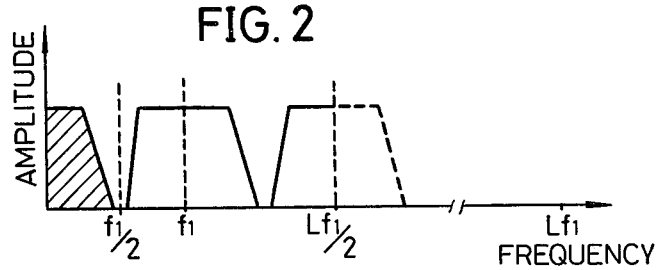
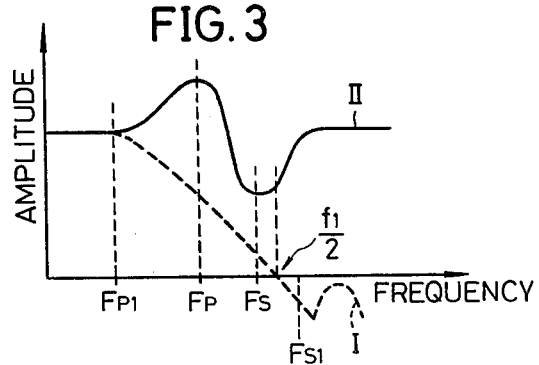
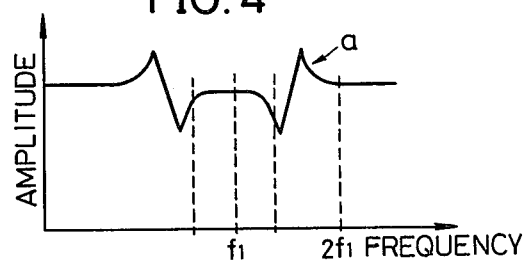

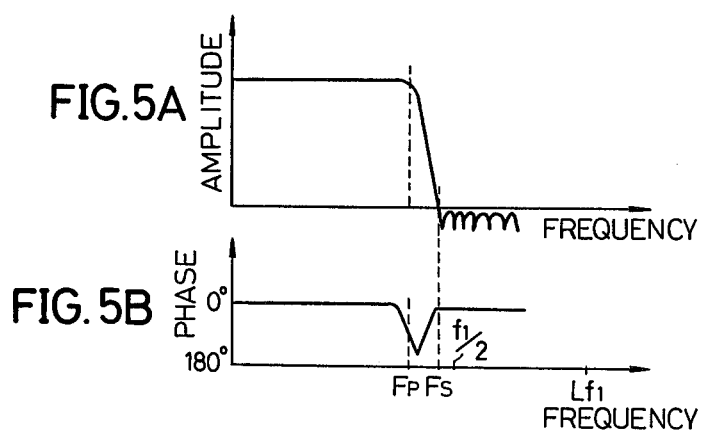
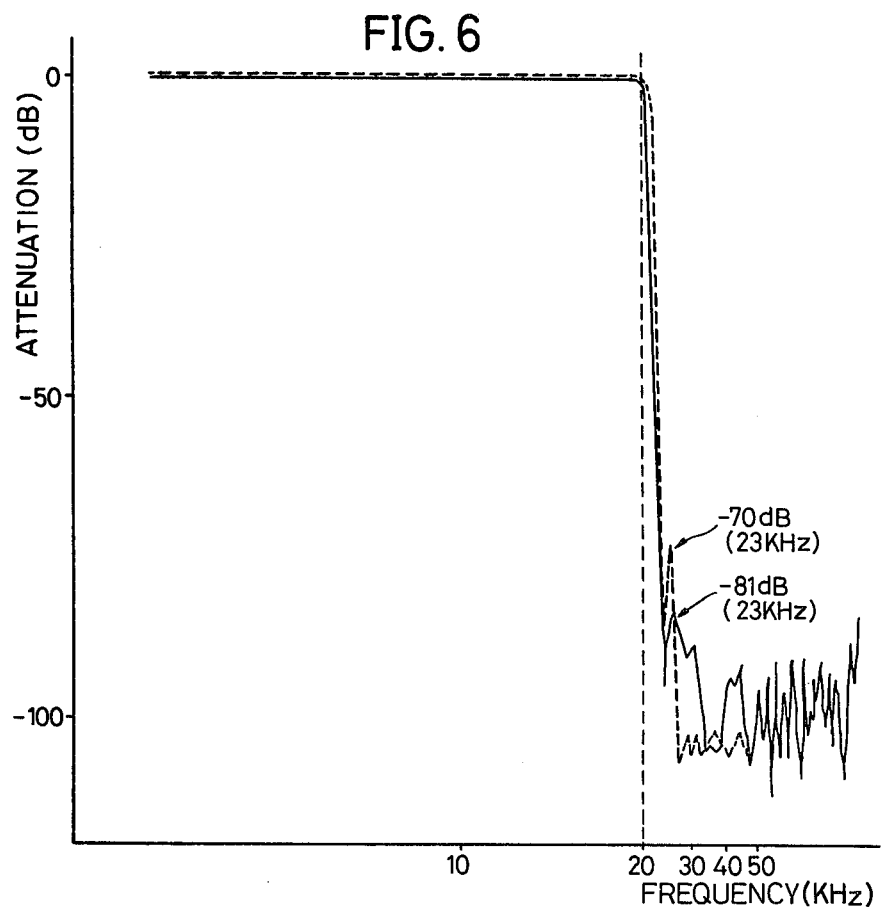

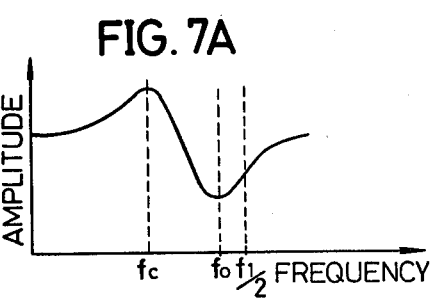
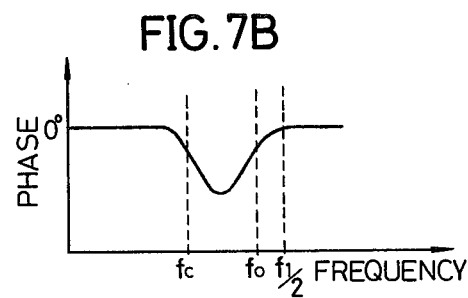
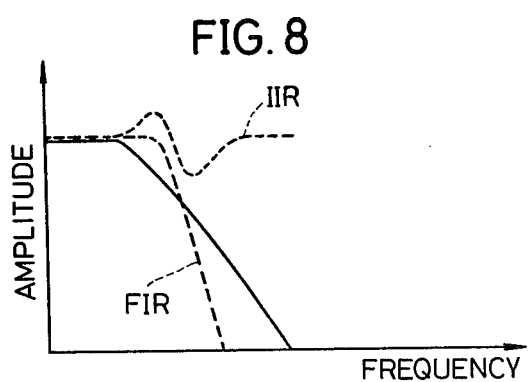
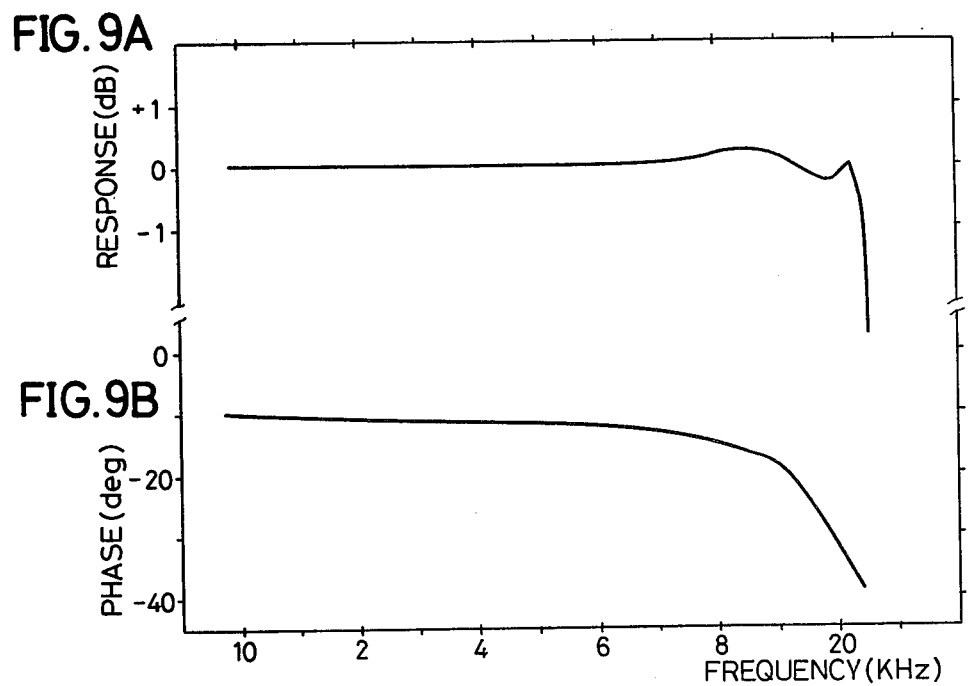

SAMPLING FREQUENCY CONVERTER

BACKGROUND OF THE INVENTION

The present invention generally relates to sampling frequency converters, and more particularly to a sampling frequency converter capable of converting (hereinafter referred to as a sampling frequency conversion) a first signal sampled at a first sampling frequency into a second signal sampled at a second sampling frequency.

In order to record a signal from a device operating at a predetermined sampling frequency with an apparatus for recording and reproducing a digital signal sampled at a sampling frequency different from the predetermined sampling frequency, a sampling frequency converter is used to convert the sampling frequency of the signal which is to be recorded, so that the sampling frequency of the signal which is to be recorded becomes equal to the sampling frequency of the recording and reproducing apparatus. Generally, the sampling frequency converter consists of an interpolation device supplied with an input signal, a filter supplied with the output of the interpolation device, and a decimation device supplied with the output of the filter.

For example, an input signal $x_n$ at a time nT which is sampled at a first sampling frequency f1 (where T indicates the sampling time, and n is an integer), is inserted with L−1 zeros (L is an integer greater than or equal to 1) at the above interpolation device. Accordingly, a signal $w_{nL+i}$ is produced from the interpolation device. This signal $w_{nL+i}$ can be described by an equation $$w_{nL+i} = \begin{cases} x_n & (i = 0) \\ 0 & (i = 1, 2, \ldots, L - 1) \end{cases}.$$

Hence, a frequency spectrum of the above signal $w_{nL+i}$ obtained from the interpolation device becomes a frequency spectrum in which a frequency spectrum part up to a frequency f1/2 is symmetrically folded and distributed up to a frequency Lf1/2.

In order to extract the output signal $w_{nL+i}$ of the interpolation device at the decimation device in a manner such that every M-th (M is an integer greater than or equal to unity) signal is extracted and the signal is converted into a signal sampled at a second sampling frequency f2, a frequency spectrum part above the frequency f1/2 must be eliminated in the above frequency spectrum of the signal $w_{nL+i}$. The above filter between the interpolation device and the decimation device is provided to eliminate this unwanted frequency spectrum part.

The signal obtained from the filter is sampled at the decimation device such that every M-th signal is extracted. Hence, an output signal $y_n$ sampled at the second sampling frequency f2 is thus obtained from the above decimation device. In this case, a relation f2/f1 = L/M stands.

The above signal $y_n$ sampled at the second sampling frequency f2 can be described by an equation $$y_n = \sum_{m=0}^{N-1} h_m \cdot w_{n-m}$$

where N is the order of the filter and $h_m$ is the impulse response of the filter. As clearly seen from this equation, the above signal $y_n$ is determined according to the performance of the filter. Thus, when designing the filter, there is a demand for the digital filter to have no aliasing (folding) distortion and no delay distortion. Further, it is desirable for the digital filter to have a simple circuit construction.

Therefore, in a case where the first sampling frequency f1 is smaller than the second sampling frequency f2, for example, a finite impulse response digital filter can be used as the above filter. However, due to the level of the present technology, the order of the filter became exceedingly high. In a case where the conversion ratio L/M = 8/7, for example, the order of the filter became over 1,000. When the order of the filter becomes high, errors are easily introduced during mathematical operations. Moreover, delay distortion is easily introduced. Further, there is a disadvantage in that the size of the apparatus becomes large since the order of the filter is high. On the other hand, in a case where the conversion ratio is a small value such as L/M = 1007/1001, for example, there were cases where a filter having a characteristic in which the passing band is one-half the frequency band of the sampling frequency for obtaining the maximum output, could not be realized. In addition, the order of the filter is reduced compared to the conventional filter when a so-called two-stage finite impulse response filter is used. However, there is still a limit to the extent the order of the filter can be reduced, and the order of the filter could not be reduced significantly.

On the other hand, in a case where the first sampling frequency f1 is larger than the second sampling frequency f2, for example, an infinite impulse response digital filter can be used. When the infinite impulse response digital filter is used to subject the signal to a decimation process, an output having a multiplication factor of 1/M was required as a result, for the sampled values extracted from every M-th signal. Accordingly, transfer functions of high order were required in both the numerator and the denominator of the transfer function equation describing the digital filter.

SUMMARY OF THE INVENTION

Accordingly, it is a general object of the present invention to provide a novel and useful sampling frequency converter in which the above described disadvantages have been overcome.

Another and more specific object of the present invention is to provide a sampling frequency converter capable of converting a sampling frequency with high quality, by providing a filter having a predetermined construction between an interpolation device and a decimation device.

Still another object of the present invention is to provide a sampling frequency converter in which the above filter is of a low order, and the phase distortion and aliasing (folding) distortion introduced when a signal recorded with a first sampling frequency is reproduced with a second sampling frequency, can be eliminated. According to the sampling frequency converter of the present invention, errors introduced during mathematical operations can be greatly reduced, since the order of the filter is low.

Other objects and further features of the present invention will be apparent from the following detailed description when read in conjunction with the accompanying drawings.

BRIEF DESCRIPTION OF THE DRAWINGS

FIG. 1 is a system block diagram showing an embodiment of a sampling frequency converter according to the present invention;

FIG. 2 is a diagram showing a frequency spectrum of an output signal from a part of the block system shown in FIG. 1;

FIG. 3 is a diagram showing frequency characteristics of a finite impulse response digital filter and an infinite impulse response digital filter;

FIG. 4 is a diagram showing a filter characteristic of an example of an infinite impulse response digital filter;

FIGS. 5A and 5B are diagrams respectively showing a total frequency characteristic of a filter in the block system shown in FIG. 1;

FIG. 6 is a diagram comparing filter characteristics of a conventional filter and a filter according to the present invention;

FIGS. 7A and 7B are diagrams respectively showing a frequency characteristic of an infinite impulse response digital filter;

FIG. 8 is a diagram showing a total frequency characteristic of a digital filter; and FIGS. 9A and 9B are diagrams respectively showing a frequency characteristic of a digital filter within a sampling frequency converter according to the present invention.

DETAILED DESCRIPTION

In FIG. 1, an input signal $x_n$ supplied to an input terminal 10 is supplied to an interpolation device 11. The above input signal $x_n$ is a signal at a time nT (n is an integer), where T is the sampling time, obtained by sampling a signal at a first sampling frequency f1. The input signal $x_n$ thus supplied to the interpolation device 11 is inserted with L−1 zeros (L is an integer greater than or equal to 1), and converted into a signal $w_{nL+i}$ which can be described by equation (1).

$$w_{nL+i} = \begin{cases} x_n & (i = 0) \\ 0 & (i = 1, 2, \ldots, L-1) \end{cases} \quad (1)$$

Accordingly, the frequency spectrum of the above signal $w_{nL+i}$ becomes as indicated in FIG. 2. That is, the frequency spectrum of the signal $w_{nL+i}$ becomes a frequency spectrum indicated by a solid line in FIG. 2 wherein the frequency spectrum of the input signal $x_n$ indicated by a part with oblique lines is symmetrically folded and distributed up to a frequency Lf1/2.

Every M-th (M is an integer greater than or equal to 1) output signal $w_{nL+i}$ from the interpolation device 11 is extracted at a decimation device 17 which will be described hereinafter. However, in order to obtain the signal $w_{nL+i}$ as a signal sampled at a second sampling frequency f2 (f1<f2, for example), the frequency spectrum part other than the part indicated by the oblique lines in FIG. 2, that is, the frequency spectrum part over the frequency f1/2, must be eliminated. Accordingly, a filter 13 provided between the interpolation device and the decimation device having a lowpass digital filter characteristic, for example, is used in order to eliminate the above frequency spectrum part other than the part indicated by the oblique lines.

Every M-th signal obtained from the above filter 13 is sampled and extracted by the decimation device 17, and converted into a signal $v_n$ which is sampled at the second sampling frequency f2. This signal $v_n$ is produced through an output terminal 18. In this case, a relation f2/f1 = L/M stands.

The sampling frequency is thus converted from the first sampling frequency f1 to the second sampling frequency f2. The above signal $v_n$ which is sampled at the second sampling frequency and produced through the terminal 18 can be described by equation (2). In equation (2), N is an integer indicating the order of the filter 13, and $h_m$ indicates the impulse response of the filter 13.

$$V_n = \sum_{m=0}^{N-1} h_m \cdot w_{n-m} \quad (2)$$

As clearly seen from the above equation (2), the signal $v_n$ is determined according to the performance of the filter 13. Accordingly, when designing the filter 13, care must be taken so that aliasing (folding) distortion and delay distortion are not introduced. Further, it is desirable to design a filter having a simple circuit construction.

However, as described, when the above filter 13 is constructed from a finite impulse response (FIR) digital filter in a case where the first sampling frequency f1 is smaller than the second sampling frequency, for example, the order of the filter became exceedingly high. Moreover, when an infinite impulse response (IIR) digital filter is used to construct the filter 13 in a case where the first sampling frequency f1 is larger than the second sampling frequency f2, for example, the order in the numerator and the denominator of the transfer function equation describing the IIR digital filter became exceedingly high.

Therefore, in the present invention, the above filter 13 is constructed from a combination of the FIR digital filter and the IIR digital filter, in order to eliminate the above described problems.

In the present embodiment of the invention, the above filter 13 consists of an FIR digital filter 14 provided with the output signal of the interpolation device through a terminal 12, and an IIR digital filter 15 supplied with an output signal of the FIR digital filter 14. An output signal of the above IIR digital filter 15 is supplied to the decimation device 17 through a terminal 16.

In the present embodiment, the IIR digital filter 15 is coupled to the output stage of the FIR digital filter 14 as shown in FIG. 1, for the following reasons. That is, the word length of the coefficients in the transfer function of a digital filter in general, is limited for these coefficients to be processed digitally. Thus, it is desirable that the word length of the coefficients is short. Generally, the IIR digital filter 15 is constituted by a recursive digital filter. For this reason, the word length of the coefficients in the transfer function of the IIR digital filter 15, becomes longer compared to the word length of the coefficients in the transfer function of the FIR digital filter 14. If the IIR digital filter 15 is coupled to the input stage of the FIR digital filter 14, the word length employed in the FIR digital filter 14 inevitably becomes long. Therefore, it is preferable not to couple the IIR digital filter 15 to the input stage of the FIR digital filter 14. Further, as will be described later on in the specification, the IIR digital filter 15 is designed to have a resonance point in the vicinity of an upper limit frequency of the passband, so that the phase characteristic thereof becomes substantially linear (flat) at least in the vicinity of the passband. Accordingly, if the IIR digital filter 15 is coupled to the input stage of the FIR digital filter 14, an overflow may occur during the operational processing in the FIR digital filter 14 at a frequency in the vicinity of the resonance point frequency of the peak in the amplitude characteristic of the IIR digital filter 15. It is for these reasons that the FIR digital filter 14 is coupled to the input stage of the IIR digital filter 15.

The FIR digital filter 14 is generally a nonrecursive digital filter described by a difference equation (3). In equation (3), N is an integer indicating the order of the filter, $a_i$ is a coefficient, $x_n$ is the input signal, and $y_n$ indicates the output signal.

$$y_n = \sum_{i=0}^{N-1} a_i \cdot x_{n-i} \quad (3)$$

The frequency characteristic of the above FIR digital filter 14 is indicated by a dotted line I in FIG. 3. As indicated in FIG. 3, a frequency $F_{p1}$ at the end of the passing band of the frequency characteristic is lower than the frequency f1/2 which is one-half of the first sampling frequency f1, and a frequency $F_{s1}$ at the end of the attenuation band is selected to a frequency slightly higher than the frequency f1/2. Thus, the FIR digital filter 14 has a lowpass filter characteristic.

On the other hand, the frequency characteristic of the above IIR digital filter 15 is indicated by a solid line II in FIG. 3. This frequency characteristic is a characteristic in which the end of the passing band is selected at a frequency $F_p$, and the end of the attenuation band is selected at a frequency $F_x$ (where $F_s > F_p$) which is slightly lower than the frequency f1/2.

A filter of the following construction, for example, can be used as the above IIR digital filter 15. First a resonance circuit having an impedance Z(s), a resonance angular frequency $\omega_o$, quality factor Q, and the like given by equation (5), is expanded into the numerator and the denominator.

$$Z(s) = \frac{s/C}{(s - s1)(s - \overline{s1})} \quad (s = j\omega) \quad (5)$$

$$\omega_o = 1/\sqrt{LC}$$

$$Q = \omega_o CR$$

$$s1 = -\omega_o/2Q + j\omega_o \sqrt{1 - (1/2Q)^2}$$

$$\overline{s1} = -\omega_o/2Q - j\omega_o \sqrt{1 - (1/2Q)^2}$$

Moreover, a transfer function H(s) of the Laplace transformation form is defined by equation (6).

$$\left. \begin{array}{l} H(s) = A_o \cdot \prod_{i=1}^{N_o/2} \dfrac{(s - s_{i2})(s - \overline{s_{i2}})}{(s - s_{i1})(s - \overline{s_{i1}})} \\ s_{i1} = -f(r_{i1}, \theta_{i1})\cos\theta_{i1} + jf(r_{i1}, \theta_{i1})\sin\theta_{i1} \\ \overline{s_{i1}} = -f(r_{i1}, \theta_{i1})\cos\theta_{i1} - jf(r_{i1}, \theta_{i1})\sin\theta_{i1} \\ s_{i2} = -f(r_{i2}, \theta_{i2})\cos\theta_{i2} + jf(r_{i2}, \theta_{i2})\sin\theta_i \\ \overline{s_{i2}} = -f(r_{i2}, \theta_{i2})\cos\theta_{i2} - jf(r_{i2}, \theta_{i2})\sin\theta_i \end{array} \right\} \quad (6)$$

In the above equation (6), $s_{i1}$ and $\overline{s_{i1}}$ indicate poles, $s_{i2}$ and $\overline{s_{i2}}$ indicate zeros, and $N_o$ is the order of the filter. Accordingly, a transfer function $H_z(z^{-1})$ of the digital filter defined by equation (7) is obtained by use of matched z-transform.

$$H_z(z^{-1}) = \prod_{i=0}^{N_o/2} A_{i0} \frac{1 + A_{i1} z^{-1} + A_{i2} z^{-2}}{1 + B_{i1} z^{-1} + B_{i1} z^{-2}} \quad (7)$$

In the above equation (7), the term $A_{i0}$ is defined by equation (8). In equation (8), $\omega_N$ indicates the normalizing angular frequency, and $T_o$ is the sampling time of the input digital signal.

$$\left. \begin{array}{l} A_{i0} = \left| \dfrac{1 + B_{i1}z_L^{-1} + B_{i2}z_L^{-2}}{1 + A_{i1}z_L^{-1} + A_{i2}z_L^{-2}} \right| z_L = \theta^{j\omega N_o T_o} \\ A_{i1} = -2A_i\cos\phi_{zi} \\ A_{i2} = A_i^2 \\ B_{i1} = -2B_i\cos\phi_{pi} \\ B_{i2} = B_i^2 \\ B_i = \exp\{-f(r_{i1}, \theta_{i1}) \cdot T \cdot \cos\theta_{i1}\} \\ A_i = \exp\{-f(r_{i2}, \theta_{i2}) \cdot T \cdot \cos\theta_{i2}\} \\ \phi_{pi} = f(r_{i1}, \theta_{i1})T \sin\theta_{i1} \\ \phi_{zi} = f(r_{i2}, \theta_{i2})T \sin\theta_{i2} \end{array} \right\} \ldots (8)$$

When obtaining an amplitude versus frequency characteristic which indicates attenuation at a range between desired angular frequencies $\omega1$ and $\omega2$ (where $\omega1 < \omega2$), the terms $f(r_{i1},\theta_{i1})$ and $f(r_{i2},\theta_{i2})$ in the above equation (6) describing the poles $s_{i1}$ and $\overline{s_{i1}}$ and the zeros $s_{i2}$ and $\overline{s_{i2}}$ are substituted by the angular frequencies $\omega1$ and $\omega2$. Furthermore, in the case where the order $N_o$ of the filter is an even number, the above $\theta_{i1}$ and $\theta_{i2}$ are respectively set to $\pi/2$. On the other hand, in the case where the order $N_o$ of the filter is an odd number, a pair of poles and one zero are positioned on the real-axis on the s-plane.

In addition, when obtaining an amplitude versus frequency characteristic which indicates intensification at the range between the angular frequencies $\omega1$ and $\omega2$, the angular frequencies $\omega1$ and $\omega2$ are substituted into the equations describing the poles $s_{i1}$ and $\overline{s_{i1}}$ and the zeros $s_{i2}$ and $\overline{s_{i2}}$ in the above equation (6).

In the above example of the IIR digital filter, it has been confirmed that the linear part in the passband of the phase characteristic is increased when the values of the above $\theta_{i1}$ and $\theta_{i2}$ are respectively set to 89.5° and 89.9°.

The IIR digital filter 15 is generally a recursive digital filter described by a difference equation (9). In equation (9), $p_n$ is the output digital signal at the time nT, $y_n$ is the input digital signal at the time nT, and $a_0$ through $a_2$, $b_1$, and $b_2$ respectively are coefficients.

$$p_n = a_0 y_n + a_1 y_{n-1} + a_2 y_{n-2} - b_1 p_{n-1} - b_2 p_{n-2} \quad (9)$$

However, when the ratio L/M in the IIR digital filter defined by the above equation (9) becomes large, the value before the decimation operation is performed must all be calculated with respect to each output digital signal $p_n$, when the filter is designed.

Therefore, in the present embodiment of the invention, the following designing method is used. First, a transfer function $H(z^{-1})$ of the IIR digital filter 15 in the z-region is defined by equation (10).

$$H(z^{-1}) = a_0 \frac{1 + a_1 z^{-1} + a_2 z^{-2}}{1 + b_1 z^{-1} + b_2 z^{-2}} \quad (10)$$

In the digital filter defined by the above equation (10), the following relationship exists between the first and second sampling frequencies.

$$f_1 L = M f_2 = i_p K f_2 \text{ or } i_p K = M \quad (11)$$

In equation (11), K is an integer, and $i_p$ is an arbitrary prime number ($i_p = 1, 2, 3, 5, \cdots$).

When the term "$z^{-1}$" in equation (10) is substituted by a term "$z^{-k}$", a following equation (12) can be obtained.

$$H(z^{-k}) = a_0 \frac{1 + a_1 z^{-k} + a_2 z^{-2k}}{1 + b_1 z^{-k} + b_2 z^{-2k}} \quad (12)$$

When the above equation (12) is written in the form of the difference equation (9), a following equation (13) is obtained.

$$p_n = a_0 y_n + a_1 y_{n-k} + a_2 y_{n-2k} - b_1 y_{n-k} - b_2 y_{n-2k} \quad (13)$$

FIG. 4 indicates the frequency characteristic of an example of an IIR digital filter described by the above equation (13). In this example, a fold is generated as indicated by a, however, the frequency characteristic indicated by the solid line II in FIG. 3 can still be obtained.

In a case where $i_p = 2$, the apparent order of the filter described by the equation (13) is "2". However, since a relation $2K = M$ can be obtained from the equation (11), it is clear that the equation (13) is multiplied by two. Accordingly, the actual order of the IIR digital filter 15 becomes "4" regardless of the value of M. For example, when the value of M is 526, the order of the mathematical operation performed with respect to the denominator in the equation (12) in a normal IIR digital filter, that is, the order of the recursive term becomes $526 \times 2 = 1052$. However, in the present embodiment of the invention, the order of the IIR digital filter 15 having every M/2-th sampling value as the input and output, is only "4".

The frequency range where the above fold indicated by a in FIG. 4 exists, is within the attenuation frequency range of the FIR digital filter 14. Accordingly, by providing sufficient attenuation quantity, the effects due to the above fold (aliasing distortion, or folding distortion) can be eliminated. Therefore, in the present embodiment of the invention, the signal supplied to the terminal 12 is given a frequency characteristic indicated in FIGS. 5A and 5B. Hence, the signal which has passed through the filter 13 is produced through the terminal 16 as a signal having only the frequency spectrum part indicated by the oblique lines in FIG. 2.

According to the experimental results obtained by the present inventor, in a case where the conventional FIR digital filter is used as the filter 13 under a condition $M=2$, $L=1$, $f1=47.25$ kHz, $f2=94.5$ kHz, $F_p=20$ kHz, and $F_s=22$ kHz, the order of the digital filter becomes "224", and the frequency characteristic of the digital filter becomes as indicated by a solid line in FIG. 6. On the other hand, according to the present embodiment of the invention, the order of the FIR digital filter 14 is "51" and the order of the IIR digital filter 15 is "4", and the order of the filter 13 as a whole becomes "55" which is an exceedingly low order. Thus, a desired frequency characteristic indicated by a dotted line in FIG. 6 can accordingly be obtained by the filter 13. In this case, the coefficients $a_0$ through $a_2$, $b_1$, and $b_2$ can respectively be obtained as follows.

$$\begin{aligned} a_0 &= 0.8259233 \\ a_1 &= -1.978136 \\ a_2 &= 0.9994894 \\ b_1 &= -1.980045 \\ b_2 &= 0.9976816 \end{aligned}$$

Moreover, the impulse response of the IFR digital filter 14 having the order of "51" becomes as follows. In the equation (13), $a_i = H(i)$.

| | | | | |
|---|---|---|---|---|
| H(1)  | = |  0.29722860E | −5 | = H(51) |
| H(2)  | = |  0.68821300E | −4 | = H(50) |
| H(3)  | = |  0.24645380E | −3 | = H(49) |
| H(4)  | = |  0.32557170E | −3 | = H(48) |
| H(5)  | = | −0.10708640E | −3 | = H(47) |
| H(6)  | = | −0.91904700E | −3 | = H(46) |
| H(7)  | = | −0.91756040E | −3 | = H(45) |
| H(8)  | = |  0.84177960E | −3 | = H(44) |
| H(9)  | = |  0.27545770E | −2 | = H(43) |
| H(10) | = |  0.13450910E | −2 | = H(42) |
| H(11) | = | −0.36163680E | −2 | = H(41) |
| H(12) | = | −0.59536470E | −2 | = H(40) |
| H(13) | = |  0.38218610E | −3 | = H(39) |
| H(14) | = |  0.10232020E | −1 | = H(38) |
| H(15) | = |  0.88977400E | −2 | = H(37) |
| H(16) | = | −0.81775670E | −2 | = H(36) |
| H(17) | = | −0.21448790E | −1 | = H(35) |
| H(18) | = | −0.64911810E | −2 | = H(34) |
| H(19) | = |  0.27803460E | −1 | = H(33) |
| H(20) | = |  0.35338160E | −1 | = H(32) |
| H(21) | = | −0.12793650E | −1 | = H(31) |
| H(22) | = | −0.71780800E | −1 | = H(30) |
| H(23) | − | −0.47199580E | −1 | = H(29) |
| H(24) | = |  0.10264440E |  0 | = H(28) |
| H(25) | = |  0.29608490E |  0 | = H(27) |
| H(26) | = |  0.38523240E |  0 | = H(26) |

In FIG. 6, attenuation quantities of −81 dB and −84 dB are respectively obtained at frequencies of 23 kHz and 24 kHz, in the conventional example. On the other hand, according to the present embodiment of the invention, attenuation quantities of −70 dB and −105 dB are respectively obtained at frequencies of 23 kHz and 24 kHz.

In addition, in a case where $i_p = 3$, that is, when $3K = M$, the order of the IIR digital filter 15 becomes "6" since the equation (13) is multiplied by three (since the IIR digital filter 15 has every M/3-th sampling value as input and output in this case). Similarly, in a case where $i_p = 1$, the order of the IIR digital filter 15 becomes "4".

Furthermore, the IIR digital filter 15 is designed so that the phase characteristic thereof is substantially linear (flat) at least in the passband. In other words, the amplitude characteristic of the IIR digital filter 15 is selected to a characteristic shown in FIG. 7A and indicated by a broken line IIR in FIG. 8. In this amplitude characteristic of the IIR digital filter 15, there is a peak due to resonance in the vicinity of an upper limit frequency (cut-off frequency) $f_c$ of the passband, and there is a dip at a frequency $f_o$. Accordingly, the roll-off frequency in the amplitude characteristic of the IIR digital filter 15, becomes in the vicinity of the above upper limit frequency $f_c$. In addition, by selecting the amplitude characteristic of the IIR digital filter 15 to such a characteristic, the phase characteristic of the IIR digital filter 15 becomes as shown in FIG. 7B. As seen from FIG. 7B, the phase characteristic of the IIR digital filter 15 is substantially linear (flat) at least under the upper limit frequency $f_c$.

On the other hand, the amplitude characteristic of the FIR digital filter 14 is selected to a characteristic indicated by a broken line FIR in FIG. 8. This amplitude characteristic of the FIR digital filter 14 cancels the peak in the vicinity of the roll-off frequency in the amplitude characteristic of the IIR digital filter 15. Moreover, the phase characteristic of the FIR digital filter 14 is substantially flat in the passband. Accordingly, the amplitude characteristic of the digital filter 13 as a whole, becomes as indicated by a solid line in FIG. 8. This amplitude characteristic of the digial filter 13 is flat in the passband, and shows a sharp roll-off attenuation characteristic. Further, the phase characteristic of the digital filter 13 as a whole, is substantially linear (flat) at least in the passband.

In the above embodiment of the invention, the relationship between the first and second sampling frequencies f1 and f2 was assumed to be f1<f2. However, in a case where f1>f2, the frequency component over the frequency f2/2 must be eliminated by the filter 13. This elimination of the frequency component is performed in order to eliminate the unwanted fold frequency component over the frequency f2/2 in advance.

The digital filter 13 consisting of the above described FIR digital filter 14 and the IIR digital filter 15 has a total frequency characteristic indicated by a solid line in FIG. 8 and FIGS. 9A and 9B.

Accordingly, when the conversion ratio f1/f2 between the first and second sampling frequencies f1 and f2 respectively are 14/15 and 21/20, the order, the multiplication number, and the ratio with respect to the multiplication number of the filter according to the present invention, respectively become as indicated by following Tables 1 and 2. Table 1 indicates a case wherein the sampling frequency is converted from 44.1 kHz into 47.25 kHz (f1<f2). On the other hand, Table 2 indicates a case wherein the sampling frequency is converted from 50.0 kHz into 48.0 kHz (f1>f2).

Moreover, a characteristic similar to that described above can also be obtained by use of a filter in which a combination consisting of a plurality of FIR digital filters 14 and IIR digital filters 15 are respectively connected in series.

Further, the present invention is not limited to these embodiments, but various variations and modifications may be made without departing from the scope of the present invention.

What is claimed is:

1. A sampling frequency converter for converting a first signal sampled at a first sampling frequency f1 into a second signal sampled at a second sampling frequency f2, said second sampling frequency f2 being equal to L/M times said first sampling frequency f1, where L and M are natural numbers satisfying L≠M, said sampling frequency converter comprising:

an interpolation device supplied with said first signal as an input signal thereof, for inserting L-1 zeros for every sampling time;

a filter circuit supplied with an output signal of said interpolation device as an input signal thereof, for attenuating a frequency component over a frequency f/2 within an output signal of said interpolation device, where f is a frequency, said filter circuit comprising a series circuit which includes a finite impulse response digital filter and an infinite impulse response digital filter which is coupled in series to an output stage of said finite impulse response digital filter, said frequency f being equal to said first sampling frequency f1 under a condition f1<f2 and being equal to said second sampling frequency f2 under a condition f1>f2; and a decimation device supplied with an output signal of said filter circuit as an input signal thereof, for extracting sampled values in the output signal of said filter circuit at a rate of one sampled value for every M sampled values in the output signal of said filter circuit, to produce said second signal.

2. A sampling frequency converter as claimed in claim 1 in which said infinite impulse response digital filter is a digital filter described by a transfer function $$H(z^{-k}) = a_0 \frac{1 + a_1 z^{-k} + a_2 z^{-2k}}{1 + b_1 z^{-k} + b_2 z^{-2k}}$$

satisfying an equation $f1L = Mf2 = i_p Kf2$ (or $i_p k = M$) where K is a natural number, $i_p$ is a prime number, and $a_0, a_1, a_2, b_1$, and $b_2$ are coefficients.

3. A sampling frequency converter as claimed in claim 1 in which said filter circuit comprises a plurality

TABLE 1

| CONVERSION RATIO | | FIR DIGITAL FILTER | 2-STAGE FIR DIGITAL FILTER | DIGITAL FILTER OF PRESENT INVENTION |
|---|---|---|---|---|
| 14/15 | ORDER OF FILTER | 1563 | 1.62~2,210 | 1.723~2.2 |
|  | MULTIPLICATION NUMBER | 111.6 | 214.4 | 71.6 |
|  | RATIO | 1.56 | 2.99 | 1 |

TABLE 2

| CONVERSION RATIO | | FIR DIGITAL FILTER | 2-STAGE FIR DIGITAL FILTER | DIGITAL FILTER OF PRESENT INVENTION |
|---|---|---|---|---|
| 21/20 | ORDER OF FILTER | 2381 | 1.47~2.341 | 1.1107~2.2 |
|  | MULTIPLICATION NUMBER |  | 344.4 | 109.1 |
|  | RATIO |  | 3.16 | 1 | of finite impulse response digital filters and a plurality of infinite impulse response digital filters which are coupled in series.

4. A sampling frequency converter as claimed in claim 1 in which the order of said infinite impulse response digital filter within said filter circuit is selected to four or six according to the value of M.

5. A sampling frequency converter as claimed in claim 1 in which said infinite impulse response digital filter has an amplitude characteristic in which an upper limit frequency of a passband thereof is in a vicinity of a roll-off frequency due to resonance, and has a phase characteristic which is substantially linear in the passband thereof, and said finite impulse response digital filter has an amplitude characteristic for cancelling a peak which is in the vicinity of the roll-off frequency in the amplitude characteristic of said infinite impulse response digital filter.

* * * * *